(12) United States Patent
Avachat

(10) Patent No.: US 8,835,212 B2
(45) Date of Patent: Sep. 16, 2014

(54) COMBINATORIAL METHODS FOR DEVELOPING SUPERSTRATE THIN FILM SOLAR CELLS

(75) Inventor: Upendra Avachat, Sunnyvale, CA (US)

(73) Assignee: Intermolecular, Inc., San Jose, CA (US)

( * ) Notice: Subject to any disclaimer, the term of this patent is extended or adjusted under 35 U.S.C. 154(b) by 119 days.

(21) Appl. No.: 13/236,430

(22) Filed: Sep. 19, 2011

(65) Prior Publication Data

US 2013/0071966 A1    Mar. 21, 2013

(51) Int. Cl.
*H01L 21/00* (2006.01)
*H01L 31/0296* (2006.01)
*H01L 31/18* (2006.01)
*H01L 21/02* (2006.01)

(52) U.S. Cl.
CPC ........ *H01L 31/0296* (2013.01); *H01L 31/1832* (2013.01); *H01L 21/0256* (2013.01)
USPC ................... 438/86; 438/84; 438/95; 438/98; 438/478

(58) Field of Classification Search
CPC ................... H01L 21/02568; H01L 21/02485; H01L 21/02557; H01L 21/0256; H01L 31/0749; H01L 21/02617; H01L 21/02631; H01L 27/1423; H01L 29/267; H01L 31/0516; H01L 31/073; H01L 31/076; H01L 31/1832
USPC .......... 438/95, 478, 84, 86, 98; 257/E31.015, 257/414, E21.091, E27.001, E29.081
See application file for complete search history.

(56) References Cited

U.S. PATENT DOCUMENTS

| | | | |
|---|---|---|---|
| 4,753,648 A * | 6/1988 | Jackson ......................... | 604/389 |
| 7,247,346 B1 * | 7/2007 | Sager et al. .................... | 427/162 |
| 8,343,797 B2 * | 1/2013 | Taliani et al. ................... | 438/86 |
| 8,476,105 B2 * | 7/2013 | Blaydes et al. ................. | 438/86 |
| 2009/0275210 A1 * | 11/2009 | Shanker et al. ............... | 438/761 |
| 2010/0248419 A1 * | 9/2010 | Woodruff et al. .............. | 438/95 |
| 2010/0282319 A1 * | 11/2010 | Taliani et al. ................. | 136/260 |
| 2011/0020971 A1 * | 1/2011 | Sun et al. ........................ | 438/57 |
| 2011/0279141 A1 * | 11/2011 | Wang et al. ............. | 324/761.01 |
| 2012/0196399 A1 * | 8/2012 | Ding et al. ....................... | 438/98 |
| 2012/0318361 A1 * | 12/2012 | Teeter et al. .................. | 136/264 |

* cited by examiner

Primary Examiner — Bac Au

(57) ABSTRACT

Methods for developing and investigating materials and processes for various layers used in manufacturing CdTe, CIGS, and CZTS TFPV superstrate devices using high productivity combinatorial techniques is described. Typical layers subjected to the HPC techniques include the buffer layers, absorber layers, and the contact interface layers.

15 Claims, 11 Drawing Sheets

COMBINATORIAL METHODS FOR DEVELOPING SUPERSTRATE THIN FILM SOLAR CELLS

FIELD OF THE INVENTION

The present invention relates generally to combinatorial methods for thin film device development. More specifically, combinatorial methods of developing copper indium gallium (sulfide) selenide (CIGS) devices, cadmium telluride (CdTe) devices, and copper zinc tin (sulfide) selenide (CZTS) devices.

BACKGROUND OF THE INVENTION

Solar cells are photovoltaic (PV) devices that convert light into electrical energy. Solar cells have been developed as clean, renewable energy sources to meet growing demand. Solar cells have been implemented in a wide number of commercial markets including residential rooftops, commercial rooftops, utility-scale PV projects, building integrated PV (BIPV), building applied PV (BAPV), PV in electronic devices, PV in clothing, etc. Currently, crystalline silicon solar cells (both single crystal and polycrystalline) are the dominant technologies in the market. Crystalline silicon solar cells must use a thick substrate (>100 um) of silicon to absorb the sunlight since it has an indirect band gap. Also, the absorption coefficient is low for crystalline silicon because of the indirect band gap. The use of a thick substrate also means that the crystalline silicon solar cells must use high quality material to provide long carrier lifetimes to allow the carriers to diffuse to the contacts. Therefore, crystalline silicon solar cell technologies lead to increased costs. Thin film solar photovoltaic (TFPV) devices based on amorphous silicon (a-Si), CIGS, CdTe, CZTS, etc. provide an opportunity to increase the material utilization since only thin films (<10 um) are generally required. The thin film Si-based solar cells may be formed from amorphous, nanocrystalline, micro-crystalline, or mono-crystalline materials. TFPV devices may have a monolithic configuration (i.e. they are comprised of a single light conversion device) or they may have a tandem configuration wherein multiple TFPV devices are used to increase the absorption efficiency within different wavelength regions of the incident light spectrum.

TFPV devices provide an opportunity to reduce energy payback time, and reduce water usage for solar panel manufacturing. CdTe and CZTS films have band gaps of about 1.5 eV and therefore, are efficient absorbers for wavelengths shorter than about 800 nm. The absorption coefficient for CdTe is about $10^5$/cm and the absorption coefficient for CZTS is about $10^4$/cm. CIGS films have bandgaps in the range of 1.0 eV (CIS) to 1.65 eV (CGS) and are also efficient absorbers across the entire visible spectrum. The absorption coefficient for CIGS is also about $10^5$/cm. Additionally, thin film devices can be fabricated at the module level, thus further decreasing the manufacturing costs. Furthermore, thin film devices may be fabricated on inexpensive substrates such as glass, plastics, and thin sheets of metal. Among the thin film solar technologies, CIGS has demonstrated the best lab cell efficiency (close to 20%) and the best large area module efficiency (>15%).

A general class of PV absorber films of special interest is formed as multinary compounds from Groups IB-IIIA-VIA of the periodic table. Group IB includes Cu, Ag, and Au. Group IIA includes B, Al, Ga, In, and Tl. Group VIA includes O, S, Se, Te, and Po. Additionally, the IB-IIIA-VIA materials can be doped with dopants from Groups VIII, IIB, IVA, VA, and VIIA of the periodic table. Group VII includes Fe, Ru, Os, Co, Rh, Ir, Ni, Pd, and Pt. Group IIB includes Zn, Cd, and Hg. Group IVA includes C, Si, Ge, Sn, and Pb. Group VA includes N, P, As, Sb, and Bi. Group VIIA includes F, Cl, Br, I, and At. Other potential absorber materials of interest include cuprous oxide, iron sulfide, etc.

TFPV devices can be fabricated at the cell level or the panel level, thus further decreasing the manufacturing costs. As used herein, the cell level is understood to mean an individual unit that can be combined with other units to form a module. As used herein, the panel level is understood to mean a large monolithic TFPV structure that is not composed of smaller units. Generally, the panels are similar in size to the aforementioned modules. For economy of language, the phrase "TFPV device" will be understood to refer to either a solar cell or a panel without distinction. Furthermore, TFPV devices may be fabricated on inexpensive substrates such as glass, plastics, and thin sheets of metal. Examples of suitable substrates comprise float glass, low-iron glass, borosilicate glass, flexible glass, specialty glass for high temperature processing, stainless steel, carbon steel, aluminum, copper, polyimide, plastics, etc. Furthermore, the substrates may be processed in many configurations such as single substrate processing, multiple substrate batch processing, inline continuous processing, roll-to-roll processing, etc.

The increasing demand for environmentally friendly, sustainable and renewable energy sources is driving the development of large area, thin film photovoltaic (TFPV) devices. With a long-term goal of providing a significant percentage of global energy demand, there is a concomitant need for Earth-abundant, high conversion efficiency materials for use in photovoltaic devices. A number of Earth abundant direct-bandgap semiconductor materials now seem to show evidence of the potential for both high efficiency and low cost in Very Large Scale (VLS) production (e.g. greater than 100 gigawatt (GW)), yet relatively little attention has been devoted to their development and characterization remains difficult because of the complexity of the materials systems involved.

Among the TFPV technologies, CIGS and CdTe are the two that have reached volume production with greater than 10% stabilized module efficiencies. Solar cell production volume must increase tremendously in the coming decades to meet sharply growing energy needs. However, the supply of indium (In), gallium (Ga) and tellurium (Te) may inhibit annual production of CIGS and CdTe solar panels. Moreover, price increases and supply constraints in In and Ga could result from the aggregate demand for these materials used in flat panel displays (FPD) and light-emitting diodes (LED) along with CIGS TFPV. Also, there are concerns about the toxicity of Cd throughout the lifecycle of the CdTe TFPV solar modules. Efforts to develop devices that leverage manufacturing and R&D infrastructure related to these TFPV technologies but using more widely available and more environmentally friendly raw materials should be considered a top priority for research. The knowledge and infrastructure developed around CdTe and CIGS TFPV technologies can be leveraged to allow faster adoption of new TFPV materials systems.

The immaturity of TFPV devices exploiting Earth abundant materials represents a daunting challenge in terms of the time-to-commercialization. That same immaturity also suggests an enticing opportunity for breakthrough discoveries. A quaternary system such as CIGS or CZTS requires management of multiple kinetic pathways, thermodynamic phase equilibrium considerations, defect chemistries, and interfacial control. The vast phase-space to be managed includes process parameters, source material choices, compositions, and overall integration schemes. Traditional R&D methods are ill-equipped to address such complexity, and the traditionally slow pace of R&D could limit any new material from reaching industrial relevance when having to compete with the incrementally improving performance of already established TFPV fabrication lines.

However, due to the complexity of the material, cell structure and manufacturing process, both the fundamental scientific understanding and large scale manufacturability are yet to be improved for CIGS and CZTS TFPV devices. As the photovoltaic industry pushes to achieve grid parity, much faster and broader investigation is needed to explore the material, device, and process windows for higher efficiency and a lower cost of manufacturing process. Efficient methods for forming different types of CIGS and CZTS TFPV devices that can be evaluated are necessary.

The efficiency of TFPV devices depends on many properties of the absorber layer and the buffer layer such as crystallinity, grain size, composition uniformity, density, defect concentration, doping level, surface roughness, etc. Many of these properties may be improved by annealing the layers at high temperatures (i.e. about 1000 C). However, this is above the melting point of soda lime glass (600 C), a common substrate for thin film solar cells, as well as other potential substrates such as plastic sheets.

The manufacture of TFPV devices entails the integration and sequencing of many unit processing steps. As an example, TFPV manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as TFPV devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, HPC processing techniques have not been successfully adapted to the development of TFPV devices.

Traditionally, TFPV devices have been manufactured with two glass plates, one on either side of the device to provide support and encapsulation. One version of TFPV device is known as a "superstrate" device. In a superstrate configuration, one glass plate is used as both a support and as the window for illumination. Therefore, the second glass plate is not required and a more cost effective encapsulate may be used to seal the TFPV device. Typically, the cost of the supporting glass plates has been similar to the active electronic materials. Therefore, TFPV devices with a superstrate configuration present an opportunity to lower the manufacturing cost for TFPV devices.

The process flow for the manufacture of superstrate TFPV devices is different from the conventional process flow. The materials, process parameters, unit processes, process sequences, process integration, etc. need to be improved to increase the efficiency.

Therefore, there is a need to apply high productivity combinatorial techniques to the development and investigation of materials and processes for the manufacture of superstrate CdTe, CIGS, and CZTS superstrate TFPV devices.

SUMMARY OF THE INVENTION

In some embodiments of the present invention, a combination of conventional and combinatorial site isolated processing techniques are used to develop and investigate materials and processes for the manufacture of superstrate CdTe TFPV devices. In some embodiments of the present invention, a combination of conventional and combinatorial site isolated processing techniques are used to develop and investigate materials and processes for the manufacture of superstrate CIGS TFPV devices. In some embodiments of the present invention, a combination of conventional and combinatorial site isolated processing techniques are used to develop and investigate materials and processes for the manufacture of superstrate CZTS TFPV devices.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

As used herein, "CIGS" will be understood to represent the entire range of related alloys denoted by $Cu_zIn_{(1-x)}Ga_xS_{(2+w)(1-y)}Se_{(2+w)y}$, where $0.5 \leq z \leq 1.5$, $0 \leq x \leq 1$, $0 \leq y \leq 1$, $-0.2 \leq w \leq 0.5$. As used herein, "CZTS" will be understood to represent the entire range of related alloys denoted by $Cu_2ZnSn(S_ySe_{1-y})_4$ where $0 \leq y \leq 1$.

Figure 3:
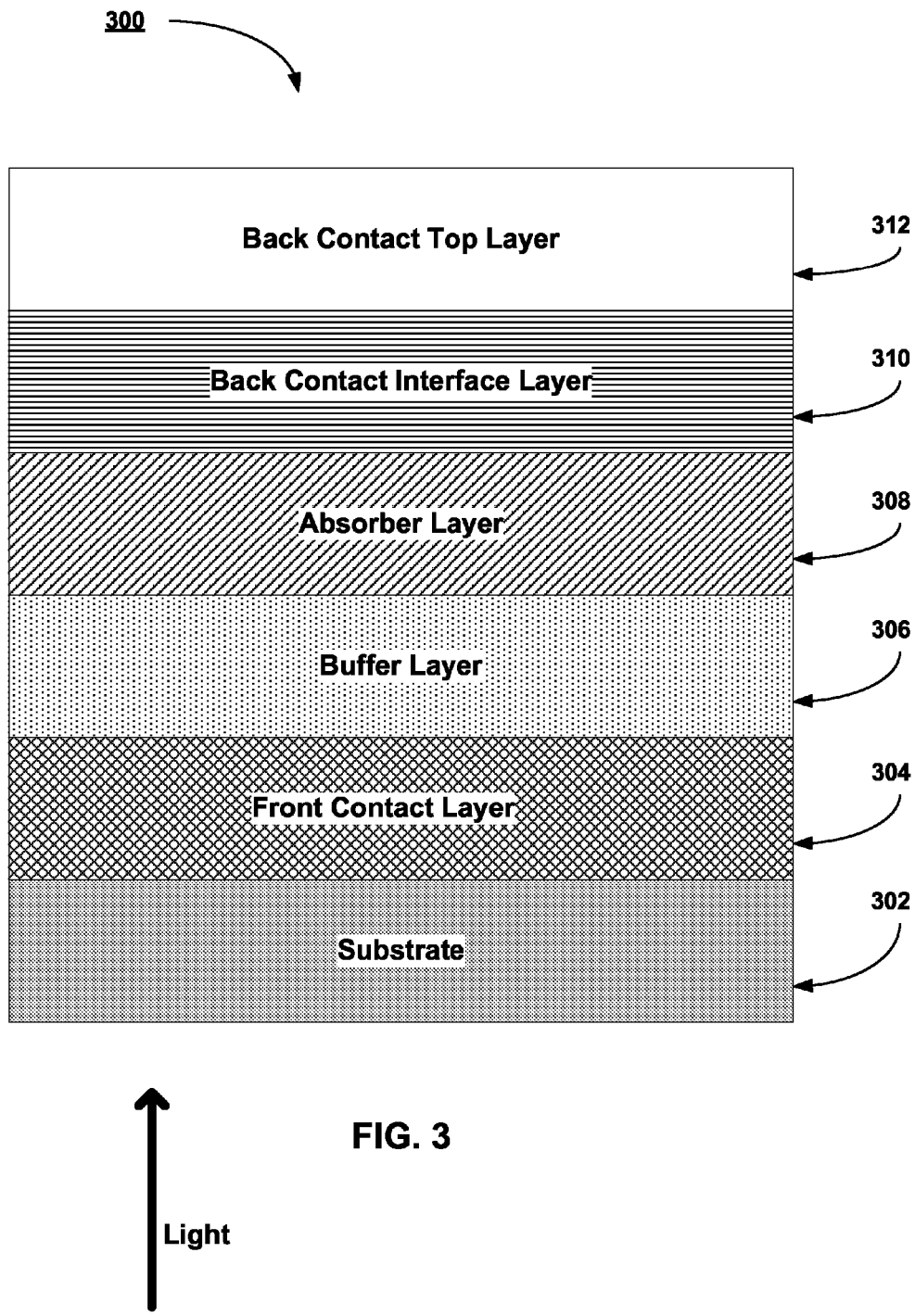
FIG. 3 illustrates a schematic diagram of a simple CdTe superstrate TFPV stack according to an embodiment described herein.
Figure 4:
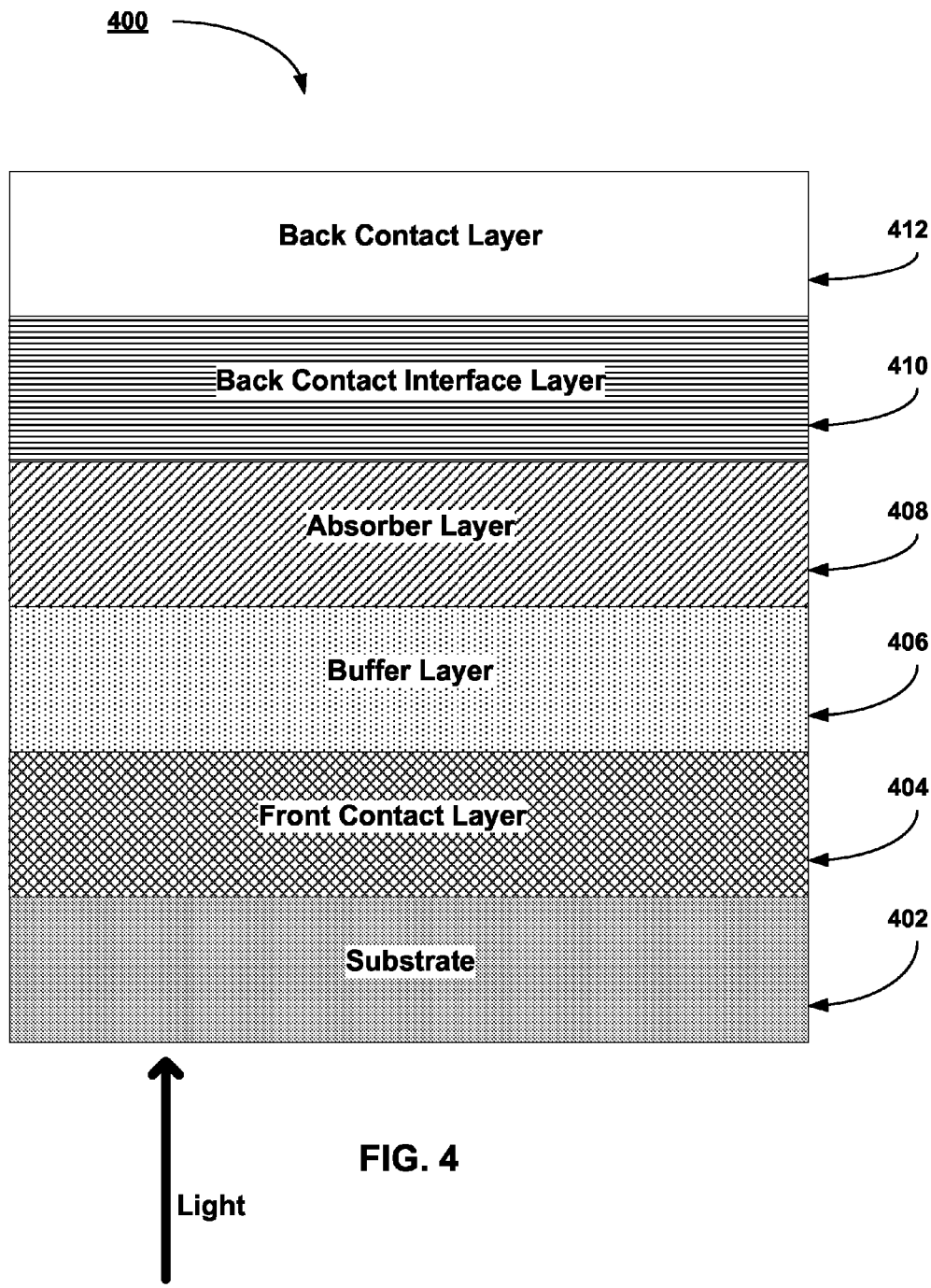
FIG. 4 illustrates a schematic diagram of a simple CIGS superstrate TFPV stack according to an embodiment described herein.
Figure 5:
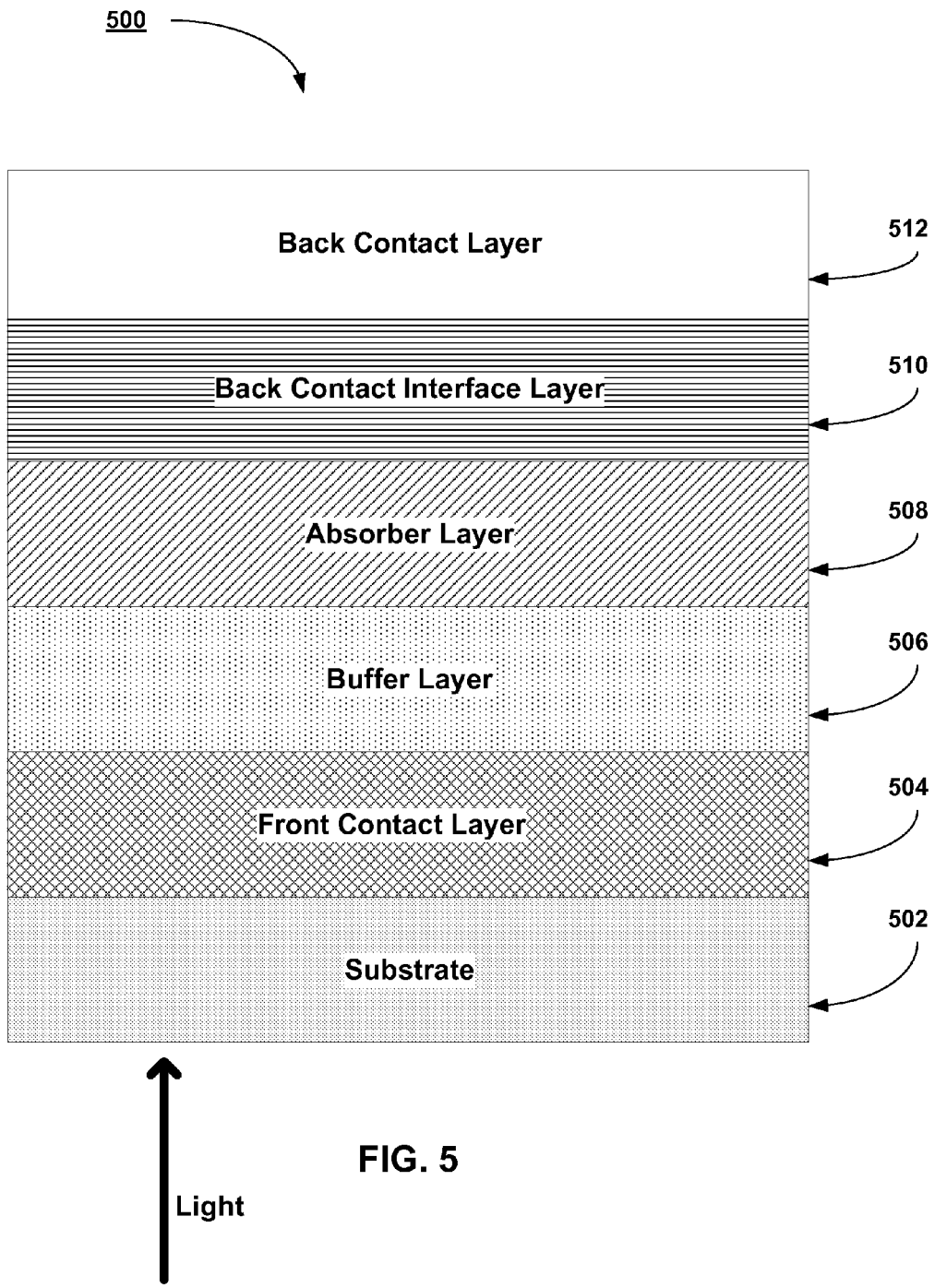
FIG. 5 illustrates a schematic diagram of a simple CZTS superstrate TFPV stack according to an embodiment described herein.

In FIGS. 3-5 below, a TFPV material stack is illustrated using a simple planar structure. Those skilled in the art will appreciate that the description and teachings to follow can be readily applied to any simple or complex TFPV device morphology. The drawings are for illustrative purposes only and do not limit the application of the present invention.

Figure 1:
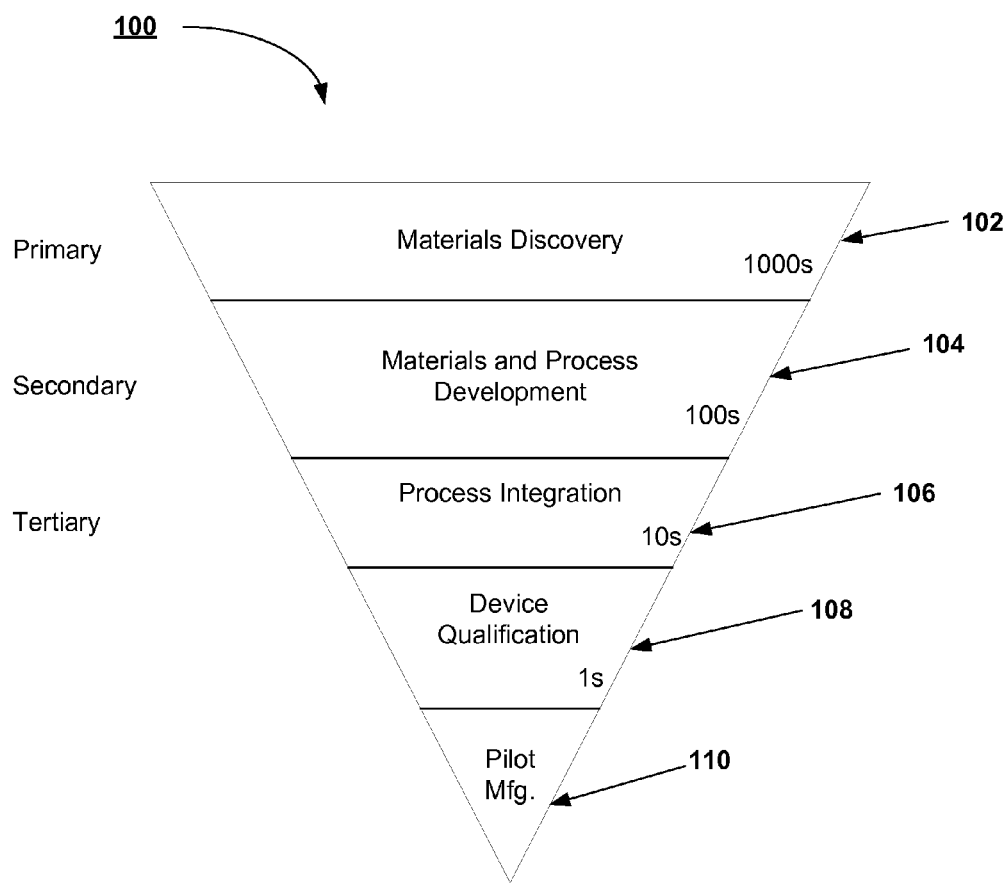
FIG. 1 is a schematic diagram for implementing combinatorial processing and evaluation.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of TFPV manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a TFPV device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a TFPV device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the TFPV device. For example, such structures may include, but would not be limited to, contact layers, buffer layers, absorber layers, or any other series of layers or unit processes that create an intermediate structure found on TFPV devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
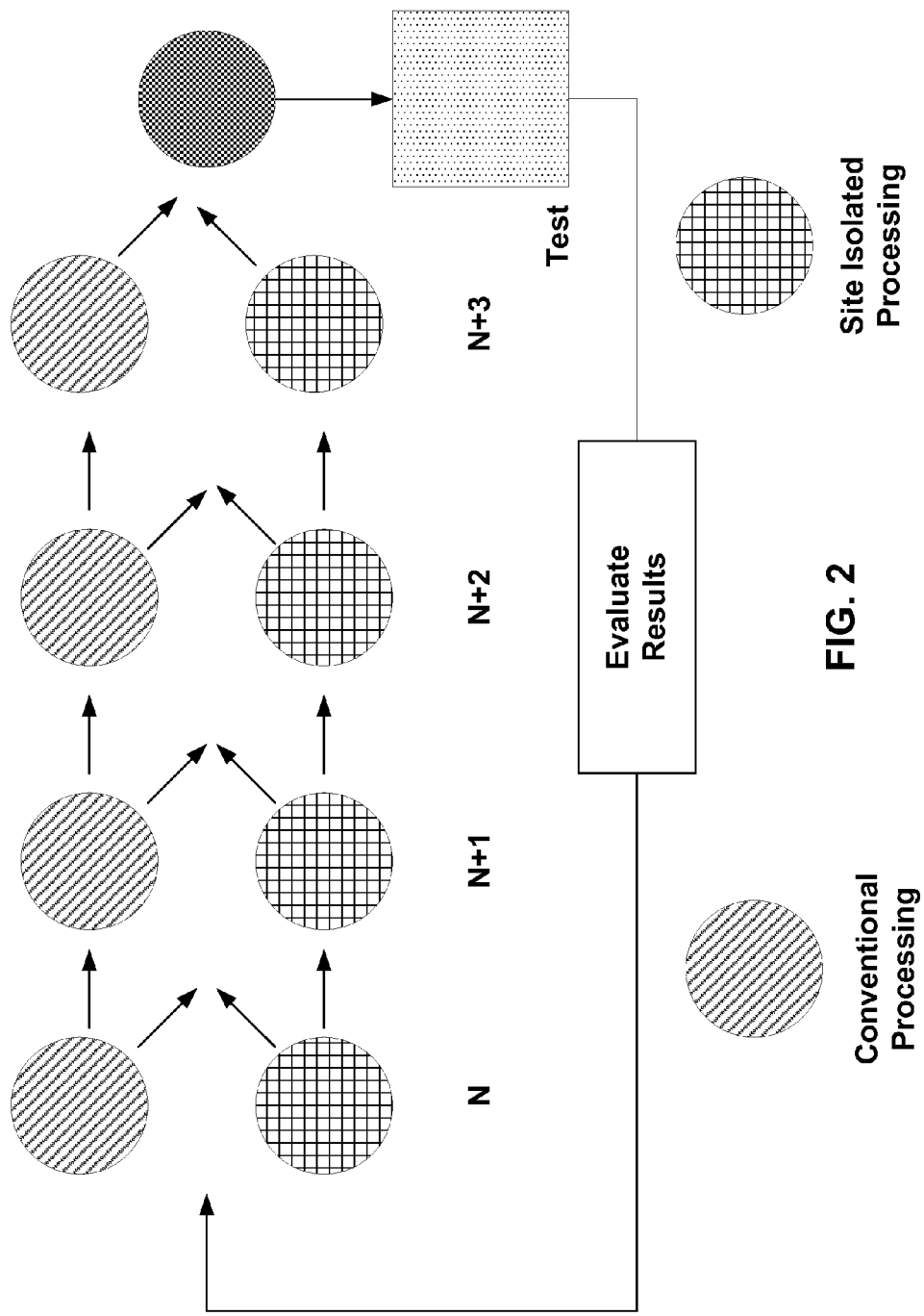
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in TFPV manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

FIG. 3 illustrates a schematic diagram of a simple CdTe superstrate TFPV stack according to an embodiment described herein. A front contact layer, 304, is formed on a substrate, 302. Typically, suitable substrates comprise soda lime glass (SLG) or a clear polymer. The light is incident on the TFPV device through the substrate. Examples of suitable front contact materials comprise indium tin oxide (ITO), fluorine doped tin oxide (SnO:F), aluminum doped zinc oxide (ZnO:Al), etc. These materials are conductive and are also substantially transparent to light in the visible spectrum. Typically, reactive PVD is the preferred method of deposition for the front contact layer. The thickness of the front contact layer is typically between about 500 nm and about 800 nm. The properties and deposition technologies for the front contact layer are well developed.

An n-type buffer layer, 306, is then deposited on top of the front contact layer. Examples of suitable n-type buffer layers comprise CdS, ZnS, CdZnS, etc. CdS is the material most often used as the n-type buffer layer in CdTe TFPV devices. The buffer layer may be deposited using chemical bath deposition (CBD), PVD, or evaporation. The thickness of the buffer layer is typically about 50 nm. The performance of the buffer layer is sensitive to materials properties such as crystallinity, grain size, surface roughness, composition, defect concentration, etc. as well as processing parameters such as temperature, deposition rate, thermal treatments, etc. Opportunities exist to improve the performance of the buffer layer.

A p-type absorber layer, 308, of CdTe is then deposited on top of the buffer layer. The absorber layer may be formed using a variety of techniques such as PVD, co-evaporation, printing or spraying of inks, CVD, etc. Typically, PVD is the preferred method of deposition for the CdTe layer. The thickness of the CdTe layer is typically between about 2.0 um and about 4.0 um. The performance of the CdTe layer is sensitive to materials properties such as crystallinity, grain size, surface roughness, composition, defect concentration, etc. as well as processing parameters such as temperature, deposition rate, thermal treatments, etc. Opportunities exist to improve the performance of the CdTe layer.

The back contact for CdTe TFPV devices may be formed from several layers. As illustrated in FIG. 3, a back contact interface layer, 310, is formed on top of the CdTe layer. Examples of suitable back contact interface layer materials comprise ZnTe:Cu, Cu$_2$Te, etc. These materials are p-type. Typically, PVD is the preferred method of deposition for the back contact interface layer. The thickness of the back contact interface layer is typically between about 300 nm and about 500 nm. The performance of the back contact interface layer is sensitive to materials properties such as crystallinity, grain size, surface roughness, composition, defect concentration, etc. as well as processing parameters such as temperature, deposition rate, thermal treatments, etc. Opportunities exist to improve the performance of the back contact interface layer.

A back contact top layer, 312, of the back contact is formed on top of the back contact interface layer. Examples of suitable back contact layer materials comprise ITO, etc. These materials are n-type. Typically, PVD is the preferred method of deposition for the back contact layer. The thickness of the back contact layer is typically about 500 nm. The properties and deposition technologies for the back contact layer are well developed.

FIG. 4 illustrates a schematic diagram of a simple CIGS superstrate TFPV stack according to an embodiment described herein. A front contact layer, 404, is formed on a substrate, 402. Typically, suitable substrates comprise soda lime glass (SLG) or a clear polymer. The light is incident on the TFPV device through the substrate. Examples of suitable front contact materials comprise indium tin oxide (ITO), fluorine doped tin oxide (SnO:F), aluminum doped zinc oxide (ZnO:Al), etc. These materials are conductive and are also substantially transparent to light in the visible spectrum. Typically, reactive PVD is the preferred method of deposition for the front contact layer. The thickness of the front contact layer is typically between about 500 nm and about 800 nm. The properties and deposition technologies for the front contact layer are well developed.

An n-type buffer layer, 406, is then deposited on top of the front contact layer. Examples of suitable n-type buffer layers comprise CdS, ZnS, CdZnS, etc. CdS is the material most often used as the n-type buffer layer in CIGS TFPV devices. The buffer layer may be deposited using chemical bath deposition (CBD), PVD, or evaporation. The thickness of the buffer layer is typically about 50 nm. The performance of the buffer layer is sensitive to materials properties such as crystallinity, grain size, surface roughness, composition, defect concentration, etc. as well as processing parameters such as temperature, deposition rate, thermal treatments, etc. Opportunities exist to improve the performance of the buffer layer.

A p-type absorber layer, 408, of CIGS is then deposited on top of the buffer layer. The absorber layer may be formed using a variety of techniques such as PVD, co-evaporation, printing or spraying of inks, CVD, etc. Typically, PVD is the preferred method of deposition for the CIGS layer. The thickness of the CIGS layer is typically between about 1.0 um and about 2.0 um. The performance of the CIGS layer is sensitive to materials properties such as crystallinity, grain size, surface roughness, composition, defect concentration, etc. as well as processing parameters such as temperature, deposition rate, thermal treatments, etc. Opportunities exist to improve the performance of the CIGS layer.

An optional back contact interface layer, 410, can be formed on the absorber layer. The back contact interface layer is typically MoSe$_2$. The MoSe$_2$ layer forms an ohmic contact to the absorber layer. The thickness of the MoSe$_2$ layer is typically between about 10 nm and about 20 nm.

A back contact layer, 412, is formed on top of the CIGS layer or the MoSe$_2$ layer if present. An example of a suitable back contact layer material is Mo. Typically, PVD is the preferred method of deposition for the back contact layer. The thickness of the back contact layer is typically between about 0.3 um and about 0.5 um. The properties and deposition technologies for the back contact layer are well developed.

FIG. 5 illustrates a schematic diagram of a simple CZTS superstrate TFPV stack according to an embodiment described herein. A front contact layer, 504, is formed on a substrate, 502. Typically, suitable substrates comprise soda lime glass (SLG) or a clear polymer. The light is incident on the TFPV device through the substrate. Examples of suitable front contact materials comprise indium tin oxide (ITO), fluorine doped tin oxide (SnO:F), aluminum doped zinc oxide (ZnO:Al), etc. These materials are conductive and are also substantially transparent to light in the visible spectrum. Typically, reactive PVD is the preferred method of deposition for the front contact layer. The thickness of the front contact layer is typically between about 500 nm and about 800 nm. The properties and deposition technologies for the front contact layer are well developed.

An n-type buffer layer, 506, is then deposited on top of the front contact layer. Examples of suitable n-type buffer layers comprise CdS, ZnS, CdZnS, etc. CdS is the material most often used as the n-type buffer layer in CZTS TFPV devices. The buffer layer may be deposited using chemical bath deposition (CBD), PVD, or evaporation. The thickness of the buffer layer is typically about 50 nm. The performance of the buffer layer is sensitive to materials properties such as crystallinity, grain size, surface roughness, composition, defect concentration, etc. as well as processing parameters such as temperature, deposition rate, thermal treatments, etc. Opportunities exist to improve the performance of the buffer layer.

A p-type absorber layer, 508, of CZTS is then deposited on top of the buffer layer. The absorber layer may be formed using a variety of techniques such as PVD, co-evaporation, printing or spraying of inks, CVD, etc. Typically, PVD is the preferred method of deposition for the CZTS layer. The thickness of the CZTS layer is typically between about 1.0 um and about 2.0 um. The performance of the CZTS layer is sensitive to materials properties such as crystallinity, grain size, surface roughness, composition, defect concentration, etc. as well as processing parameters such as temperature, deposition rate, thermal treatments, etc. Opportunities exist to improve the performance of the CZTS layer.

An optional back contact interface layer, 510, can be formed on the absorber layer. The back contact interface layer is typically $MoSe_2$. The $MoSe_2$ layer forms an ohmic contact to the absorber layer. The thickness of the $MoSe_2$ layer is typically between about 10 nm and about 20 nm.

A back contact layer, 512, is formed on top of the CZTS layer or the $MoSe_2$ layer if present. An example of a suitable back contact layer material is Mo. Typically, PVD is the preferred method of deposition for the back contact layer. The thickness of the back contact layer is typically between about 0.3 um and about 0.5 um. The properties and deposition technologies for the back contact layer are well developed.

Figure 6:
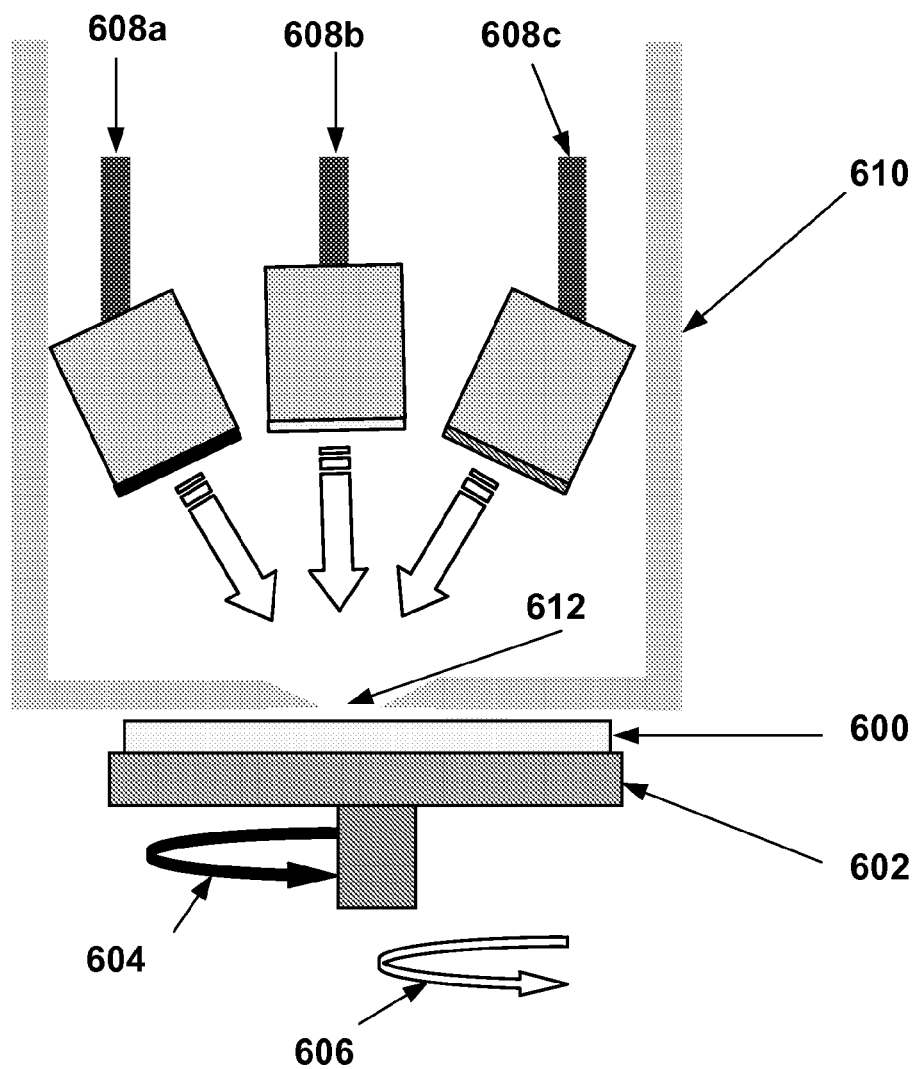
FIG. 6 illustrates a schematic diagram of a combinatorial PVD system according to an embodiment described herein.

FIG. 6 illustrates a schematic diagram of a combinatorial PVD system according to an embodiment described herein. Details of the combinatorial PVD system are described in U.S. patent application Ser. No. 12/027,980 filed on Feb. 7, 2008 and claiming priority to Sep. 5, 2007 and U.S. patent application Ser. No. 12/028,643 filed on Feb. 8, 2008 and claiming priority to Sep. 5, 2007. Substrate, 600, is held on substrate support, 602. Substrate support, 602, has two axes of rotation, 604 and 606. The two axes of rotation are not aligned. This feature allows different regions of the substrate to be accessed for processing. The substrate support may be moved in a vertical direction to alter the spacing between the PVD targets and the substrate. The combinatorial PVD system comprises multiple PVD assemblies configured within a PVD chamber (not shown). In FIG. 6, three PVD assemblies are shown, 608a-608c. Those skilled in the art will appreciate that any number of PVD assemblies may be used, limited only by the size of the chamber and the size of the PVD assemblies. Typically, four PVD assemblies are contained within the chamber. Advantageously, the multiple PVD assemblies contain different target materials to allow a wide range of material and alloys compositions to be investigated. Additionally, the combinatorial PVD system will typically include the capability for reactive sputtering in reactive gases such as $O_2$, $NH_3$, $N_2$, etc. The PVD assemblies may be moved in a vertical direction to alter the spacing between the PVD targets and the substrate and may be tilted to alter the angle of incidence of the sputtered material arriving at the substrate surface. The combinatorial PVD system further comprises a process kit shield assembly, 610. The process kit shield assembly includes an aperture, 612, used to define isolated regions on the surface. The portion of the process kit shield assembly that includes the aperture may have both rotational and translational capabilities. The combination of the substrate support movement, PVD assembly movement, and process kit shield assembly aperture movement allows multiple regions of the substrate to be processed in a site isolated manner wherein each site can be processed without interference from adjacent regions. Advantageously, the process parameters among the multiple site isolated regions can be varied in a combinatorial manner.

Figure 7:
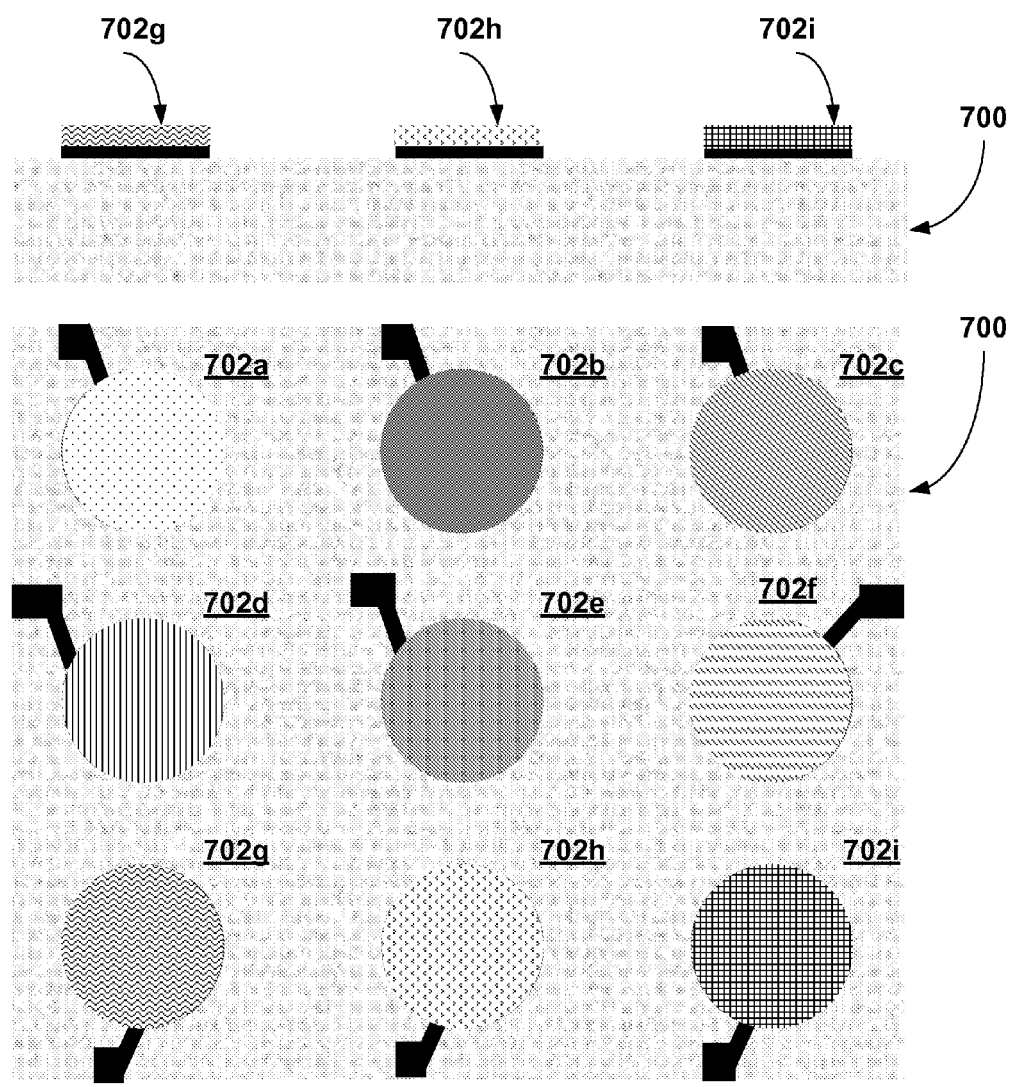
FIG. 7 illustrates a schematic diagram of a substrate that has been processed in a combinatorial manner.

FIG. 7 illustrates a schematic diagram of a substrate that has been processed in a combinatorial manner. Although the substrate in FIG. 7 is illustrated as being a generally square shape, those skilled in the art will understand that the substrate may be any useful shape such as round, rectangular, etc. FIG. 7 illustrates a substrate, 700, with nine site isolated regions, 702a-702i, illustrated thereon. The lower portion of FIG. 7 illustrates a top down view while the upper portion of FIG. 7 illustrates a cross-sectional view taken through the three site isolated regions, 702g-702i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 8:
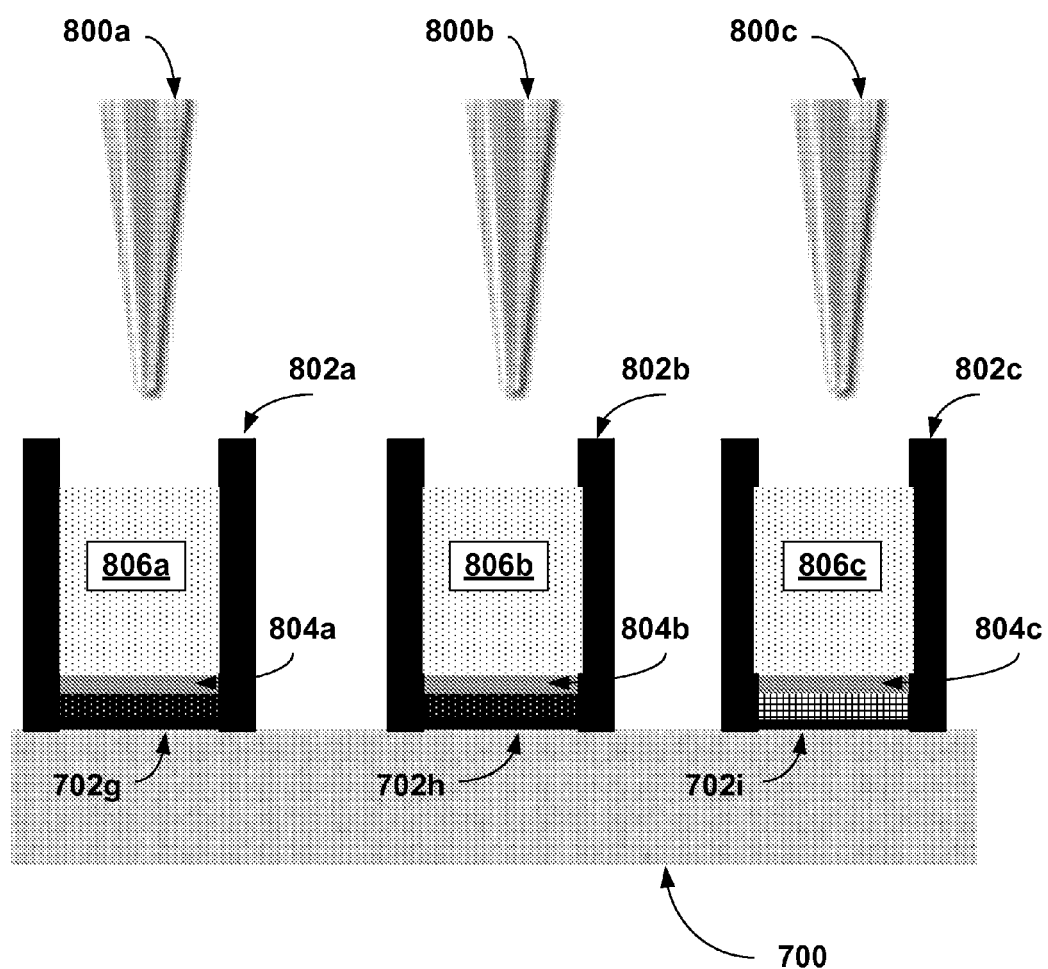
FIG. 8 illustrates a schematic diagram of a combinatorial wet processing system according to an embodiment described herein.

FIG. 8 illustrates a schematic diagram of a combinatorial wet processing system according to an embodiment described herein. In the same manner that the combinatorial PVD system may be used to investigate materials deposited by PVD, a combinatorial wet system may be used to investigate materials deposited by solution-based techniques. An example of a combinatorial wet system is described in U.S. Pat. No. 7,544,574 cited earlier. Those skilled in the art will realize that this is only one possible configuration of a combinatorial wet system. FIG. 8 illustrates a cross-sectional view of substrate, 700, taken through the three site isolated regions, 702g-702i similar to the upper portion of FIG. 7. Solution dispensing nozzles, 800a-800c, supply different solution chemistries, 806a-806b, to chemical processing cells, 802a-8062. FIG. 8 illustrates the deposition of a layer, 804a-804c, on respective site isolated regions. Although FIG. 8 illustrates a deposition step, other solution-based processes such as cleaning, etching, surface treatment, surface functionalization, etc. may be investigated in a combinatorial manner. Advantageously, the solution-based treatment can be customized for each of the site isolated regions.

Figure 9:
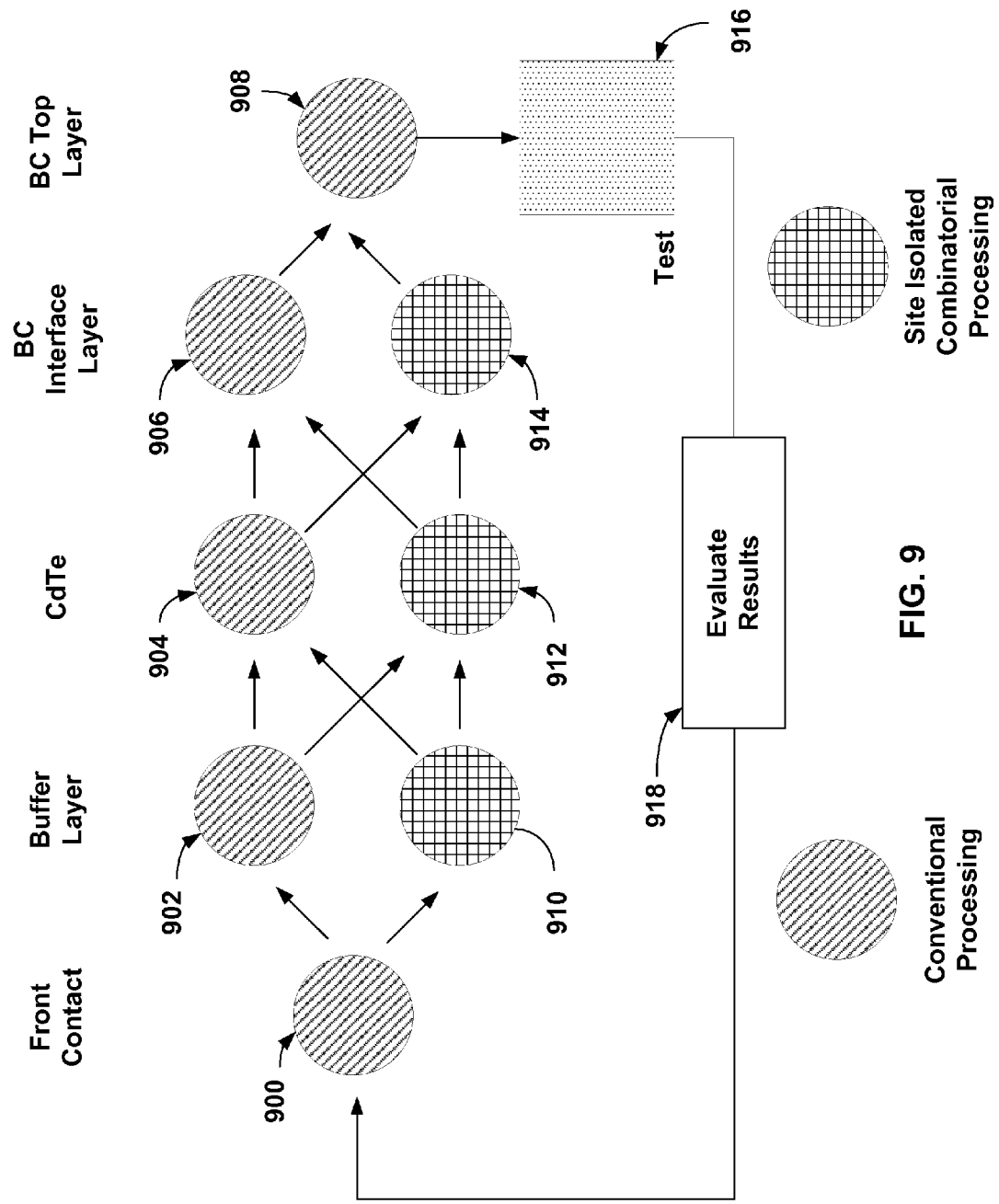
FIG. 9 illustrates a flow diagram for forming a simple CdTe superstrate TFPV stack according to an embodiment described herein.

FIG. 9 illustrates a diagram of potential process sequences for forming a simple CdTe superstrate TFPV stack according to an embodiment described herein. As discussed in relation to FIG. 3, several of the layers provide opportunities to apply combinatorial techniques to the development and investigation of the materials and treatments for the layers. For CdTe TFPV devices, candidate layers include the buffer layer, the CdTe absorber layer, and the back contact interface layer.

Examples of suitable n-type buffer layers comprise CdS, ZnS, CdZnS, etc. CdS is the material most often used as the n-type buffer layer in CdTe TFPV devices. The material composition of the buffer layer may be varied in a combinatorial manner. The buffer layer may be deposited using chemical bath deposition (CBD), PVD, or evaporation. The PVD and evaporation processes are typically conducted in a vacuum environment. The deposition of the CdS layer by CBD may be investigated using HPC techniques by varying process parameters such as bath chemistry, bath component concentration, bath temperature, bath pH, etc. As an example, the deposition rate is sensitive to the concentration of $NH_4OH$, a common component of the bath. These are meant to be illustrative parameters and those skilled in the art will be able to apply HPC techniques to any of the commonly used process parameters. The deposition of the CdS layer by PVD may be investigated using HPC techniques by varying process parameters such as power, pressure, target to substrate distance, atomic ratio, etc. These are meant to be illustrative parameters and those skilled in the art will be able to apply HPC techniques to any of the commonly used process parameters.

A second layer that may be investigated using HPC techniques includes the CdTe absorber layer. The material composition of the CdTe absorber layer may be varied in a combinatorial manner. The absorber layer may be formed using a variety of techniques such as PVD, co-evaporation, printing or spraying of inks, CVD, etc. The PVD, CVD, and evaporation processes are typically conducted in a vacuum environment. Typically, PVD is the preferred method of deposition for the CdTe layer. The deposition of the CdTe layer by PVD may be investigated using HPC techniques by varying process parameters such as power, pressure, target to substrate distance, atomic ratio, etc. These are meant to be illustrative parameters and those skilled in the art will be able to apply HPC techniques to any of the commonly used process parameters. The deposition of the CdTe layer by co-evaporation may be investigated using HPC techniques by varying process parameters such as power, pressure, source to substrate distance, atomic ratio, etc. These are meant to be illustrative parameters and those skilled in the art will be able to apply HPC techniques to any of the commonly used process parameters. The deposition of the CdTe layer by printing or spraying of inks may be investigated using HPC techniques by varying process parameters such as ink composition, ink concentration, ink viscosity, solvent concentration, ink volume per application, etc. These are meant to be illustrative parameters and those skilled in the art will be able to apply HPC techniques to any of the commonly used process parameters.

A third layer that may be investigated using HPC techniques includes the back contact interface layer. Examples of suitable back contact interface layer materials comprise ZnTe:Cu, $Cu_2Te$, etc. These materials are p-type. The material composition of the back contact interface layer may be varied in a combinatorial manner. Typically, PVD is the preferred method of deposition for the back contact interface layer. The PVD processes are typically conducted in a vacuum environment. The deposition of the back contact interface layer by PVD may be investigated using HPC techniques by varying process parameters such as power, pressure, target to substrate distance, atomic ratio, etc. These are meant to be illustrative parameters and those skilled in the art will be able to apply HPC techniques to any of the commonly used process parameters.

Returning to FIG. 9, through the use of a combination of conventional and combinatorial processing systems (i.e. systems capable of processing multiple isolated regions on a single substrate) a number of trajectories through the various systems illustrated in the flow diagram of FIG. 9 can be envisioned. In FIG. 9, the front contact layer may be deposited in a conventional processing manner, 900, since the front contact layer is well characterized for CdTe TFPV devices. As discussed previously, the buffer layer may be deposited in a conventional processing manner, 902, or in a site isolated combinatorial processing manner, 910. As discussed previously, the CdTe layer may be deposited in a conventional processing manner, 904, or in a site isolated combinatorial processing manner, 912. As discussed previously, the back contact interface layer may be deposited in a conventional processing manner, 906, or in a site isolated combinatorial processing manner, 914. The back contact ITO layer may be deposited in a conventional processing manner, 908, since the front contact layer is well characterized for CdTe TFPV devices. After the deposition of the various layers and subsequent processing, the various devices represented by each of the site isolated regions may be testing in step 916, and the results evaluated in step, 918. As discussed previously, the results will form the basis for additional cycles of investigation through HPC techniques to identify materials and process conditions that increase the efficiency of the CdTe TFPV device.

Using the simple diagram in FIG. 9, there are eight possible trajectories through the process sequence. These eight trajectories encompass all of the possible combinations of conventional and combinatorial processing illustrated. Those skilled in the art will understand that HPC techniques may be applied to other processes not illustrated such as anneal treatments, cleaning, etching, surface treatments, surface functionalization, etc. As more variable process steps are included, the total number of required experiments increases dramatically. This illustrates the benefits of using HPC techniques to limit the number of substrates to a manageable number and minimize the cost of the development program. The eight possible trajectories through the process sequence are listed in Table 1 below using the process step identifiers from FIG. 9:

TABLE 1

| Front Contact | Buffer Layer | CdTe Layer | BC Interface Layer | BC ITO Layer |
|---|---|---|---|---|
| 900 | 902 | 904 | 906 | 908 |
| 900 | 902 | 904 | 914 | 908 |
| 900 | 902 | 912 | 906 | 908 |
| 900 | 902 | 912 | 914 | 908 |
| 900 | 910 | 904 | 906 | 908 |
| 900 | 910 | 904 | 914 | 908 |
| 900 | 910 | 912 | 906 | 908 |
| 900 | 910 | 912 | 914 | 908 |

Figure 10:
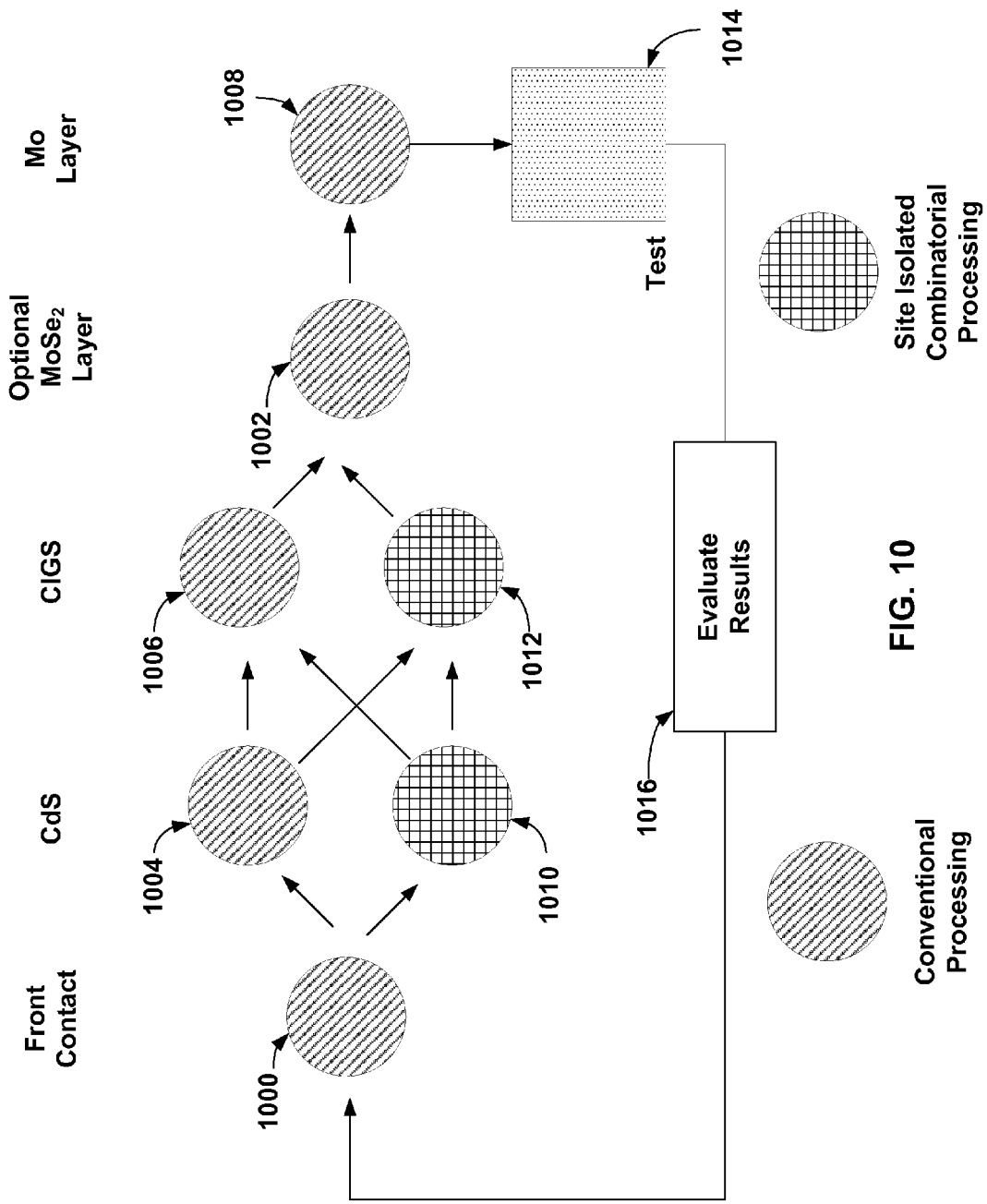
FIG. 10 illustrates a flow diagram for forming a simple CIGS superstrate TFPV stack according to an embodiment described herein.

FIG. 10 illustrates a diagram of potential process sequences for forming a simple CIGS superstrate TFPV stack according to an embodiment described herein. As discussed in relation to FIG. 4, several of the layers provide opportunities to apply combinatorial techniques to the development and investigation of the materials and treatments for the layers. For CIGS TFPV devices, candidate layers include the buffer layer, and the CIGS absorber layer.

Examples of suitable n-type buffer layers comprise CdS, ZnS, CdZnS, etc. CdS is the material most often used as the n-type buffer layer in CIGS TFPV devices. The material composition of the buffer layer may be varied in a combinatorial manner. The buffer layer may be deposited using chemical bath deposition (CBD), PVD, or evaporation. The PVD and evaporation processes are typically conducted in a vacuum environment. The deposition of the CdS layer by CBD may be investigated using HPC techniques by varying process parameters such as bath chemistry, bath component concentration, bath temperature, bath pH, etc. As an example, the deposition rate is sensitive to the concentration of $NH_4OH$, a common component of the bath. These are meant to be illustrative parameters and those skilled in the art will be able to apply HPC techniques to any of the commonly used process parameters. The deposition of the CdS layer by PVD may be investigated using HPC techniques by varying process parameters such as power, pressure, target to substrate distance, atomic ratio, etc. These are meant to be illustrative parameters and those skilled in the art will be able to apply HPC techniques to any of the commonly used process parameters.

The second layer that may be investigated using HPC techniques includes the CIGS absorber layer. The material composition of the CIGS absorber layer may be varied in a combinatorial manner. The absorber layer may be formed using a variety of techniques such as PVD, co-evaporation, printing or spraying of inks, CVD, etc. The PVD, CVD, and evaporation processes are typically conducted in a vacuum environment. Typically, PVD is the preferred method of deposition for the CIGS layer. The deposition of the CIGS layer by PVD may be investigated using HPC techniques by varying process parameters such as power, pressure, target to substrate distance, atomic ratio, etc. These are meant to be illustrative parameters and those skilled in the art will be able to apply HPC techniques to any of the commonly used process parameters. The deposition of the CIGS layer by co-evaporation may be investigated using HPC techniques by varying process parameters such as power, pressure, source to substrate distance, atomic ratio, etc. These are meant to be illustrative parameters and those skilled in the art will be able to apply HPC techniques to any of the commonly used process parameters. The deposition of the CIGS layer by printing or spraying of inks may be investigated using HPC techniques by varying process parameters such as ink composition, ink concentration, ink viscosity, solvent concentration, ink volume per application, etc. These are meant to be illustrative parameters and those skilled in the art will be able to apply HPC techniques to any of the commonly used process parameters.

Returning to FIG. 10, through the use of a combination of conventional and combinatorial processing systems (i.e. systems capable of processing multiple isolated regions on a single substrate) a number of trajectories through the various systems illustrated in the flow diagram of FIG. 10 can be envisioned. In FIG. 10, the front contact layer may be deposited in a conventional processing manner, 1000, since the front contact layer is well characterized for CIGS TFPV devices. As discussed previously, the buffer layer may be deposited in a conventional processing manner, 1004, or in a site isolated combinatorial processing manner, 1010. As discussed previously, the CIGS layer may be deposited in a conventional processing manner, 1006, or in a site isolated combinatorial processing manner, 1012. Additionally, the optional $MoSe_2$ layer may be deposited in a conventional processing manner, 1002, since the optional $MoSe_2$ layer is well characterized for CIGS TFPV devices. The back contact Mo layer may be deposited in a conventional processing manner, 1008, since the back contact layer is well characterized for CIGS TFPV devices. After the deposition of the various layers and subsequent processing, the various devices represented by each of the site isolated regions may be testing in step 1014, and the results evaluated in step, 1016. As discussed previously, the results will form the basis for additional cycles of investigation through HPC techniques to identify materials and process conditions that increase the efficiency of the CIGS TFPV device.

Using the simple diagram in FIG. 10, there are four possible trajectories through the process sequence. These four trajectories encompass all of the possible combinations of conventional and combinatorial processing illustrated. Those skilled in the art will understand that HPC techniques may be applied to other processes not illustrated such as anneal treatments, cleaning, etching, surface treatments, surface functionalization, etc. As more variable process steps are included, the total number of required experiments increases dramatically. This illustrates the benefits of using HPC techniques to limit the number of substrates to a manageable number and minimize the cost of the development program. The four possible trajectories through the process sequence are listed in Table 2 below using the process step identifiers from FIG. 10:

TABLE 2

| Front Contact | Buffer Layer | CIGS Layer | Optional $MoSe_2$ Layer | Mo Layer |
|---|---|---|---|---|
| 1000 | 1004 | 1006 | 1002 | 1008 |
| 1000 | 1004 | 1012 | 1002 | 1008 |
| 1000 | 1010 | 1006 | 1002 | 1008 |
| 1000 | 1010 | 1012 | 1002 | 1008 |

Figure 11:
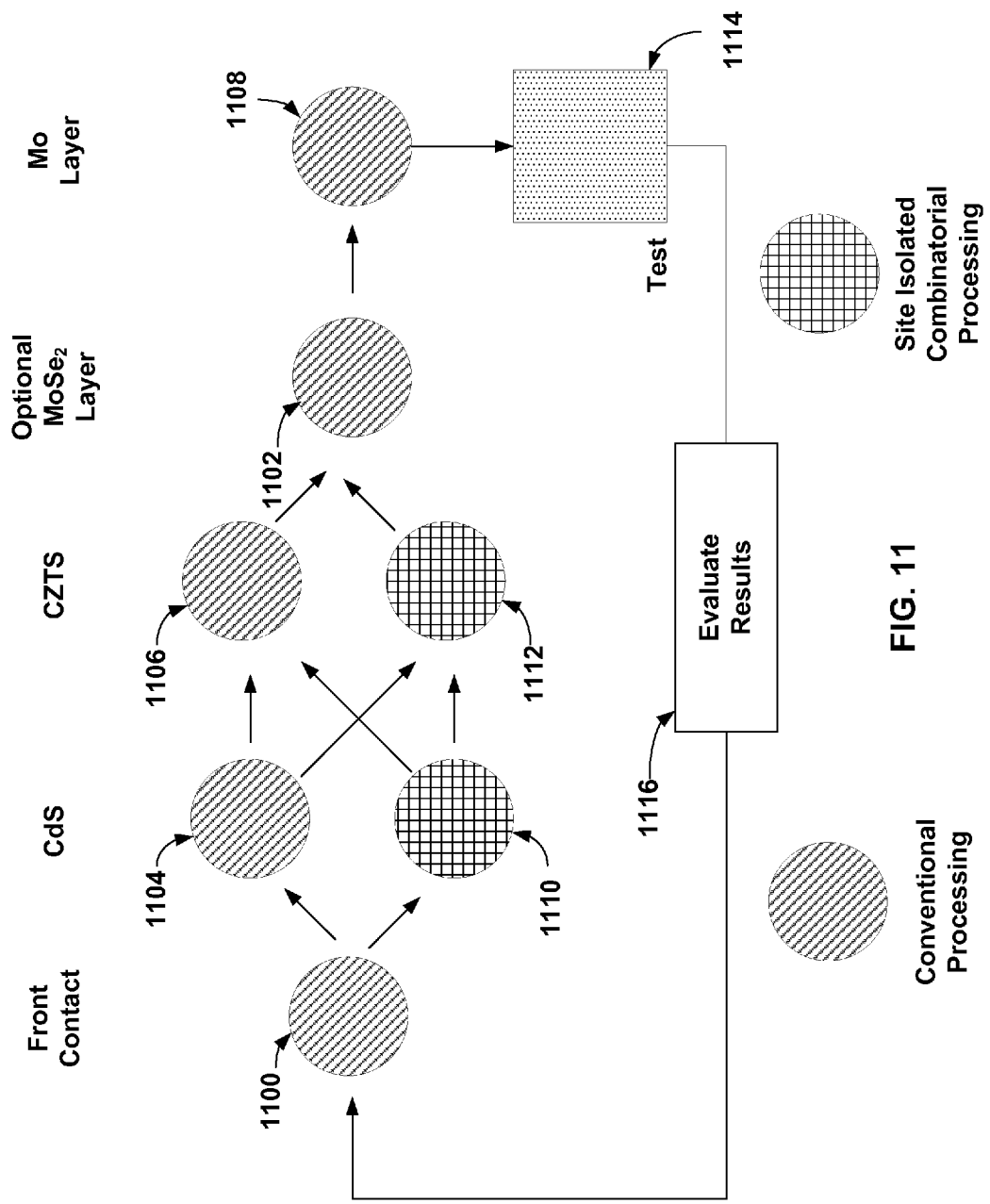
FIG. 11 illustrates a flow diagram for forming a simple CZTS superstrate TFPV stack according to an embodiment described herein.

FIG. 11 illustrates a diagram of potential process sequences for forming a simple CZTS superstrate TFPV stack according to an embodiment described herein. As discussed in relation to FIG. 5, several of the layers provide opportunities to apply combinatorial techniques to the development and investigation of the materials and treatments for the layers. For CZTS TFPV devices, candidate layers include the buffer layer, and the CZTS absorber layer.

Examples of suitable n-type buffer layers comprise CdS, ZnS, CdZnS, etc. CdS is the material most often used as the n-type buffer layer in CIGS TFPV devices. The material composition of the buffer layer may be varied in a combinatorial manner. The buffer layer may be deposited using chemical bath deposition (CBD), PVD, or evaporation. The PVD and evaporation processes are typically conducted in a vacuum environment. The deposition of the CdS layer by CBD may be investigated using HPC techniques by varying process parameters such as bath chemistry, bath component concentration, bath temperature, bath pH, etc. As an example, the deposition rate is sensitive to the concentration of $NH_4OH$, a common component of the bath. These are meant to be illustrative parameters and those skilled in the art will be able to apply HPC techniques to any of the commonly used process parameters. The deposition of the CdS layer by PVD may be investigated using HPC techniques by varying process parameters such as power, pressure, target to substrate distance, atomic ratio, etc. These are meant to be illustrative parameters and those skilled in the art will be able to apply HPC techniques to any of the commonly used process parameters.

The second layer that may be investigated using HPC techniques includes the CZTS absorber layer. The material composition of the buffer layer may be varied in a combinatorial manner. The absorber layer may be formed using a variety of techniques such as PVD, co-evaporation, printing or spraying of inks, CVD, etc. The PVD, CVD, and evaporation processes are typically conducted in a vacuum environment. Typically, PVD is the preferred method of deposition for the CZTS layer. The deposition of the CZTS layer by PVD may be investigated using HPC techniques by varying process parameters such as power, pressure, target to substrate distance, atomic ratio, etc. These are meant to be illustrative parameters and those skilled in the art will be able to apply HPC techniques to any of the commonly used process parameters. The deposition of the CZTS layer by co-evaporation may be investigated using HPC techniques by varying process parameters such as power, pressure, source to substrate distance, atomic ratio, etc. These are meant to be illustrative parameters and those skilled in the art will be able to apply HPC techniques to any of the commonly used process parameters. The deposition of the CZTS layer by printing or spraying of inks may be investigated using HPC techniques by varying process parameters such as ink composition, ink concentration, ink viscosity, solvent concentration, ink volume per application, etc. These are meant to be illustrative parameters and those skilled in the art will be able to apply HPC techniques to any of the commonly used process parameters.

Returning to FIG. 11, through the use of a combination of conventional and combinatorial processing systems (i.e. systems capable of processing multiple isolated regions on a single substrate) a number of trajectories through the various systems illustrated in the flow diagram of FIG. 11 can be envisioned. In FIG. 11, the front contact layer may be deposited in a conventional processing manner, 1100, since the front contact layer is well characterized for CZTS TFPV devices. As discussed previously, the buffer layer may be deposited in a conventional processing manner, 1104, or in a site isolated combinatorial processing manner, 1110. As discussed previously, the CZTS layer may be deposited in a conventional processing manner, 1106, or in a site isolated combinatorial processing manner, 1112. Additionally, the optional MoSe$_2$ layer may be deposited in a conventional processing manner, 1102, since the optional MoSe$_2$ layer is well characterized for CZTS TFPV devices. The back contact Mo layer may be deposited in a conventional processing manner, 1108, since the back contact layer is well characterized for CZTS TFPV devices. After the deposition of the various layers and subsequent processing, the various devices represented by each of the site isolated regions may be testing in step 1114, and the results evaluated in step, 1116. As discussed previously, the results will form the basis for additional cycles of investigation through HPC techniques to identify materials and process conditions that increase the efficiency of the CZTS TFPV device.

Using the simple diagram in FIG. 11, there are four possible trajectories through the process sequence. These four trajectories encompass all of the possible combinations of conventional and combinatorial processing illustrated. Those skilled in the art will understand that HPC techniques may be applied to other processes not illustrated such as anneal treatments, cleaning, etching, surface treatments, surface functionalization, etc. As more variable process steps are included, the total number of required experiments increases dramatically. This illustrates the benefits of using HPC techniques to limit the number of substrates to a manageable number and minimize the cost of the development program. The four possible trajectories through the process sequence are listed in Table 3 below using the process step identifiers from FIG. 11:

TABLE 2

| Front Contact | Buffer Layer | CZTS Layer | Optional MoSe$_2$ Layer | Mo Layer |
|---|---|---|---|---|
| 1100 | 1104 | 1106 | 1102 | 1108 |
| 1100 | 1104 | 1112 | 1102 | 1108 |
| 1100 | 1110 | 1106 | 1102 | 1108 |
| 1100 | 1110 | 1112 | 1102 | 1108 |

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for the development of superstrate thin film photovoltaic devices of CdTe comprising:
    forming a front contact layer above a substrate, the substrate operable to allow at least some electromagnetic radiation in the visible light spectrum to pass through it;
    forming a buffer layer above the front contact layer;
    forming a CdTe absorber layer above the buffer layer;
    forming a back contact interface layer on the CdTe absorber layer; and
    forming a back contact top layer on the back contact interface layer;
    wherein at least two of the steps of forming a back contact interface layer, forming a buffer layer, or forming a CdTe absorber layer are performed using combinatorial processing;
    wherein the combinatorial processing is conducted in a vacuum environment:
    wherein the at least two of the steps of forming the buffer layer, forming the CdTe absorber layer, and forming the back contact interface layer using combinatorial processing comprises using PVD to deposit material on site-isolated regions of the substrate and varying process parameters for the PVD among the site-isolated regions: and
    wherein the process parameters comprise material composition, power, pressure, target to substrate distance, and atomic ratio.

2. The method of claim 1 wherein the combinatorial processing processes multiple regions of the substrate in a site isolated manner.

3. The method of claim 2 wherein process parameters used to process the multiple regions of the substrate are varied in a combinatorial manner.

4. The method of claim 1 wherein the material composition of at least one of the buffer layer, the CdTe absorber layer, or the back contact interface layer are varied in a combinatorial manner.

5. The method of claim 1 wherein the PVD is performed in a combinatorial PVD system comprising a process kit shield assembly comprising an aperture used to define the site-isolated regions on the substrate and multiple PVD assemblies containing a plurality of target materials.

6. A method for the development of superstrate thin film photovoltaic devices of CIGS comprising:
    forming a front contact layer above a substrate, the substrate operable to allow at least some electromagnetic radiation in the visible light spectrum to pass through it;
    forming a buffer layer above the front contact layer;
    forming a CIGS absorber layer above the buffer layer;
    forming a back contact interface layer on the CIGS absorber layer; and
    forming a back contact top layer on the back contact interface layer;
    wherein the steps of: forming a buffer layer and forming a CIGS absorber layer are performed using combinatorial processing:
    wherein the combinatorial processing is conducted in a vacuum environment:
    wherein the steps of forming the buffer layer and forming the CIGS absorber layer using combinatorial processing comprises using PVD to deposit material on site-isolated regions of the substrate and varying process parameters for the PVD; and wherein the process parameters comprise material composition, power, pressure, target to substrate distance, and atomic ratio.

7. The method of claim 6 wherein the combinatorial processing processes multiple regions of the substrate in a site isolated manner.

8. The method of claim 7 wherein process parameters used to process the multiple regions of the substrate are varied in a combinatorial manner.

9. The method of claim 6 wherein the material composition of at least one of the buffer layer, or the CIGS absorber layer, are varied in a combinatorial manner.

10. The method of claim 6 wherein the PVD is performed in a combinatorial PVD system comprising a process kit shield assembly comprising an aperture used to define the site-isolated regions on the substrate and multiple PVD assemblies containing a plurality of target materials.

11. A method for the development of superstrate thin film photovoltaic devices of CZTS comprising:
- forming a front contact layer above a substrate, the substrate operable to allow at least some electromagnetic radiation in the visible light spectrum to pass through it;
- forming a buffer layer above the front contact layer;
- forming a CZTS absorber layer above the buffer layer;
- forming a back contact interface layer on the CZTS absorber layer; and
- forming a back contact top layer on the back contact interface layer;
- wherein the steps of forming a buffer layer and forming a CZTS absorber layer are performed using combinatorial processing;
- wherein the combinatorial processing is conducted in a vacuum environment:
- wherein the steps of forming the buffer layer and forming the CZTS absorber layer using combinatorial processing comprises using PVD to deposit material on site-isolated regions of the substrate and varying process parameters for the deposition: and wherein the process parameters comprise material composition, power, pressure, target to substrate distance, and atomic ratio.

12. The method of claim 11 wherein the combinatorial processing processes multiple regions of the substrate in a site isolated manner.

13. The method of claim 12 wherein process parameters used to process the multiple regions of the substrate are varied in a combinatorial manner.

14. The method of claim 11 wherein the material composition of at least one of the buffer layer, or the CZTS absorber layer, are varied in a combinatorial manner.

15. The method of claim 11 wherein the PVD is performed in a combinatorial PVD system comprising a process kit shield assembly comprising an aperture used to define the site-isolated regions on the substrate and multiple PVD assemblies containing a plurality of target materials.

* * * * *